(12) United States Patent
Takazaki

(10) Patent No.: US 9,471,040 B2
(45) Date of Patent: *Oct. 18, 2016

(54) RIGID DECORATIVE MEMBER

(71) Applicants: CITIZEN HOLDINGS CO., LTD., Tokyo (JP); CITIZEN WATCH CO., LTD., Tokyo (JP)

(72) Inventor: Koutarou Takazaki, Saitama (JP)

(73) Assignees: CITIZEN HOLDINGS CO., LTD., Tokyo (JP); CITIZEN WATCH CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/385,164

(22) PCT Filed: Feb. 28, 2013

(86) PCT No.: PCT/JP2013/055493
§ 371 (c)(1),
(2) Date: Sep. 14, 2014

(87) PCT Pub. No.: WO2013/140989
PCT Pub. Date: Sep. 26, 2013

(65) Prior Publication Data
US 2015/0044508 A1 Feb. 12, 2015

(30) Foreign Application Priority Data
Mar. 19, 2012 (JP) .................. 2012-062812

(51) Int. Cl.
*C23C 14/06* (2006.01)
*G04B 37/22* (2006.01)
(Continued)

(52) U.S. Cl.
CPC ......... *G04B 37/221* (2013.01); *C23C 14/0015* (2013.01); *C23C 14/0036* (2013.01);
(Continued)

(58) Field of Classification Search
USPC ....... 204/192, 192.15, 192.16; 428/336, 697, 428/698, 699
See application file for complete search history.

(56) References Cited

U.S. PATENT DOCUMENTS 4,252,862 A * 2/1981 Nishida ................ C23C 28/321
428/699
6,503,373 B2 * 1/2003 Eerden ................ C23C 14/024
204/192.12

(Continued)

FOREIGN PATENT DOCUMENTS

CN 102534532 * 7/2012
DE 10337456 A1 6/2004
(Continued)

OTHER PUBLICATIONS

International Search Report for PCT/JP2013/055493, Apr. 2, 2013.
(Continued)

*Primary Examiner* — Archene Turner

(57) ABSTRACT

Provided is a rigid decorative member that has high film hardness, is excellent in scratch resistance performance and abrasion resistance performance, and has excellent color brightness and color saturation. The rigid decorative member of the present invention is a rigid decorative member wherein a reaction compound film of an alloy of Cr and a metal selected from one or two or more of Mo, W, Nb, Ta, Ti, Hf, Zr, and V, and of a non-metallic element selected from one or two or more of nitrogen, carbon, and oxygen is formed on a substrate. There is provided the rigid decorative member significantly improved in scratch resistance and abrasion resistance and having a color tone with a high quality feel; and there is further supplied a product of which the color tones of brightness and color saturation can be freely controlled. The rigid decorative member of the present invention includes the reaction compound film of the alloy of Cr, which is a metal having high adhesion to a metal and high brightness but having low hardness, and a metal having high film hardness and high corrosion resistance but having low brightness and low adhesion (Mo, W, Nb, Ta, Ti, Hf, Zr, V), and of the non-metallic element such as nitrogen, carbon, or oxygen.

8 Claims, 12 Drawing Sheets

(51) Int. Cl.
*C23C 14/00* (2006.01)
*C23C 14/16* (2006.01)
*C23C 14/08* (2006.01)
*C23C 14/02* (2006.01)
*C23C 28/04* (2006.01)

(52) U.S. Cl.
CPC ......... *C23C14/024* (2013.01); *C23C 14/0635* (2013.01); *C23C 14/0641* (2013.01); *C23C 14/08* (2013.01); *C23C 14/165* (2013.01); *C23C 28/042* (2013.01); *C23C 28/044* (2013.01); *C23C 28/048* (2013.01)

(56) References Cited

U.S. PATENT DOCUMENTS

| | | | |
|---|---|---|---|
| 9,120,933 B2 * | 9/2015 | Takazaki | C23C 14/0015 |
| 2005/0079369 A1 | 4/2005 | Stachowiak | |
| 2008/0014420 A1 * | 1/2008 | Chan | C23C 14/0015 428/698 |
| 2011/0296873 A1 * | 12/2011 | Derrig | A44C 27/006 63/15 |

FOREIGN PATENT DOCUMENTS

| | | |
|---|---|---|
| GB | 2358197 A | 7/2001 |
| JP | S54-85214 A | 7/1979 |
| JP | H04-017665 A | 1/1992 |
| JP | 2004-043959 A | 2/2004 |
| JP | 2006-274444 A | 10/2006 |
| JP | 2007-262472 A | 10/2007 |
| JP | 2011-256424 A | 12/2011 |
| WO | 2010/150411 A1 | 12/2010 |

OTHER PUBLICATIONS

State Intellectual Property Office of the People's Republic of China, Office Action for Chinese patent application No. 201380015165.X, Jul. 2, 2015.

European Patent Office, Extended European Search Report for EP Patent Application No. 13764481.1, Oct. 1, 2015.

* cited by examiner

RIGID DECORATIVE MEMBER

TECHNICAL FIELD

The present invention relates to decorative members having metallic colors for exterior parts of watches, personal ornaments such as glasses and accessories, decorative trim, and the like, and sporting goods, and particularly relates to a rigid decorative member with a white color or a stainless steel color that has high brightness and a color having a high quality feel, and is excellent in scratch resistance, abrasion resistance, and an anticorrosion for a long period.

BACKGROUND ART

A platinum coating having high brightness has been conventionally formed on the outermost layer of an abrasion-resistant layer for improving the scratch resistance of exterior parts, personal ornaments such as glasses, accessories, and watches, decorative trims, sporting goods, and the like so as to have an appearance with a high quality feel. For example, in Patent Literature 1, an undercoat layer is formed on a base, a Ti carbide film is formed on the surface thereof by a dry coating method, and a decorative coating comprising platinum or a platinum alloy formed by a dry coating method is formed on the surface thereof. However, it has been preferable to thinly form the film since the platinum layer as the outermost layer has been expensive; and the Ti carbide film has been preferably made to have a pale color in order to suppress color change due to peeling of the thin platinum layer. Therefore, the hardness of the Ti carbide film has been low (about 40%) compared to the hardness of a typical Ti carbide film, and it has been impossible to obtain sufficient scratch resistance.

Further, when hardness is increased by increasing the amount of carbon allowed to react with the Ti carbide film in order to improve scratch resistance, a color tone is darkened although the scratch resistance is improved. Further, there is a problem that peeling of a film due to increasing film stress and pitting corrosion in a corrosion resistance test are prone to occur when the film thickness of the Ti carbide film which is a hardened layer is increased in order to similarly improve scratch resistance. Thus, it has been difficult to form the film having a film thickness of 1.0 μm or more.

Furthermore, there has been a problem that a platinum-based coating causes an allergy when the coating is brought into contact with human skin.

Thus, it has been proposed to use a Mo coating having good brightness, a good color tone, and a good low-splash property, having scratch resistance, and having a high quality feel instead of the platinum-based coating as the outermost layer. However, there has been a problem that it has been impossible to use the Mo coating without being processed since the Mo coating has had low corrosion resistance. Although it has been proposed to use a Cr coating having good brightness, a good color tone, and a good low-splash property, and having a high quality feel, there has been a problem that the Cr coating has low film hardness, resulting in insufficient scratch resistance, and it has been difficult to peel the Cr coating in a production step since the Cr coating has very high corrosion resistance.

On the other hand, it has been proposed to use, as the outermost layer, a Nb carbide film or a Ta carbide film having high hardness and having corrosion resistance. However, there has been a problem that it has been also impossible to use the coatings without being processed since the coatings have low adhesion to a base, low scratch resistance due to the impossibility of allowing a film thickness to be large, and also low brightness.

CITATION LIST

Patent Literature

Patent Literature 1: Japanese Laid-open Patent Publication No. 2004-043959
Patent Literature 2: Japanese Laid-open Patent Publication No. 2007-262472

SUMMARY OF INVENTION

Technical Problem

An object of the present invention is to provide a rigid decorative member in which deterioration of appearance quality due to a flaw, abrasion, or the like is suppressed by significantly improving scratch resistance and which has a color tone with a high quality feel; and to further supply a product of which the film hardness, scratch resistance performance, abrasion resistance performance, color tone, and corrosion resistance performance can be freely controlled.

Solution to Problem

In order to achieve the above-described object, the rigid decorative member of the present invention employs configurations described below.

(1) A rigid decorative member including:
a base; and
a rigid decorative coating with a single layer or plural layers containing a reaction compound of an alloy of Cr and one or two or more selected from the group consisting of Mo, W, Nb, Ta, Ti, Hf, Zr, and V, and of one or two or more non-metallic elements of nitrogen, carbon, and oxygen, stacked on the base.

(2) The rigid decorative member according to the above (1), wherein the non-metallic element in the coating mainly includes nitrogen.

(3) The rigid decorative member according to the above (1), containing the rigid decorative coating with the plural layers, wherein the rigid decorative coating with the several layers includes an adhesion layer stacked on the substrate, a gradient adhesion layer stacked on the adhesion layer, an abrasion-resistant layer stacked on the gradient adhesion layer, and a recolored gradient layer stacked on the abrasion-resistant layer; a non-metallic element in the adhesion layer is low-concentration oxygen; a non-metallic element in the gradient adhesion layer, the abrasion-resistant layer, and the recolored gradient layer includes one or two or more of nitrogen, carbon, and oxygen; the content of a non-metallic element in a reaction compound included in the gradient adhesion layer is increased in a gradient manner in a thickness direction with departing from the substrate; and the content of a non-metallic element in a reaction compound included in the recolored gradient layer is increased or decreased in a gradient manner in a thickness direction with departing from the substrate.

(4) The rigid decorative member according to the above (3), wherein the thickness of the abrasion-resistant layer is 0.5 to 4 μm.

(5) The rigid decorative member according to any of the above (1) to (4), wherein the proportion of the Cr is 20 wt % or more.

(6) The rigid decorative member according to any one of the above (1) to (5), wherein the appearance color of the rigid decorative member is a white color or a stainless steel color.

(7) A watch including an exterior part of which at least a portion includes the rigid decorative member according to any one of (1) to (6).

(8) A method for producing the rigid decorative member according to any of (1) to (7), including at least one step of: a step of forming the adhesion layer by a reactive sputtering method; a step of forming the gradient adhesion layer by a reactive sputtering method; a step of forming the abrasion-resistant layer by a reactive sputtering method; and a step of forming the recolored gradient layer by a reactive sputtering method.

(9) The method for producing a rigid decorative member according to the above (8), wherein the amount of a reactant gas containing the non-metallic element used in the reactive sputtering method in the step of forming the gradient adhesion layer and the step of forming the recolored gradient layer is chronologically increased.

Advantageous Effects of Invention

In accordance with the present invention, there is provided a rigid decorative member in which deterioration of appearance quality due to a flaw, abrasion, or the like is suppressed and which has a color tone with a high quality feel; and there can be further provided a product of which the film hardness, scratch resistance performance, abrasion resistance performance, color tone, corrosion resistance performance, and etching performance can be freely controlled.

DESCRIPTION OF EMBODIMENTS

Rigid Decorative Member

Figure 1:
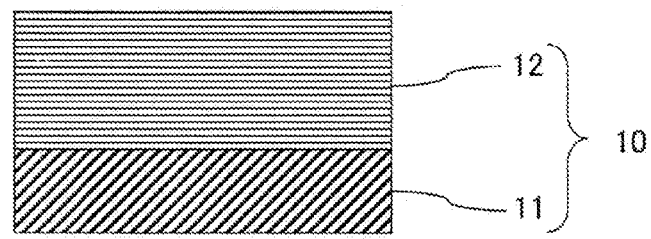
FIG. 1 illustrates a cross-sectional schematic view illustrating one example of the structure of a rigid decorative member of the present invention.

The structure of the rigid decorative member of the present invention will be explained with reference to FIG. 1. An abrasion-resistant layer 12 including a carbide of a CrMo alloy is formed on a surface of an SUS316L base 11 as the base.

An alloy film is employed, whereby the rigid decorative member of the present invention has a characteristic in that adhesion performance, film hardness, scratch resistance performance, abrasion resistance performance, color tone, and corrosion resistance performance can be freely controlled by the proportion of each metal included in the alloy.

The hardness, brightness, and color saturation of the rigid decorative member 10 can be changed depending on a desired property; when scratch resistance is desired, a carbon content at which the maximum hardness is exhibited can be adjusted, while, when high brightness is desired, a carbon content depending on the high brightness can be adjusted.

In such a manner, the problems of the conventional art are solved in the rigid decorative member of the present invention.

The rigid decorative member 10 of the present invention is formed of the base 11 and the abrasion-resistant layer 12 formed on the surface of the base 11.

<Base>

The base 11 is preferably a base formed of a metal or ceramic. Specific examples of metals (including alloys) include stainless steel, titanium, titanium alloy, copper, copper alloy, tungsten, or stainless steel, titanium, and titanium alloy subjected to hardening treatment, and the like.

The metals may be used singly or in combination of two or more kinds of metals. Further, the shape of the base 11 is not limited.

<Abrasion-Resistant Layer>

The abrasion-resistant layer 12 is formed of a reaction compound of an alloy of Cr and one or two or more selected from the group consisting of Mo, W, Nb, Ta, Ti, Hf, Zr, and V, and of one or two or more non-metallic elements of nitrogen, carbon, and oxygen. The kinds of materials to be selected are determined depending on an appearance color and an environment in which a coating is used. In addition to the metals, a metal such as B, Al, Si, Mn, Co, La, Ce, Y, or Sc at a rate of 5 wt % or less in total in the alloy may also be contained in the alloy.

It is desirable that the content of carbon, nitrogen, or the admixture elements thereof in the abrasion-resistant layer is 0 to 70 atm %.

It is desirable that the thickness of the abrasion-resistant layer is 0.2 to 4 μm. Further, it is desirable that the hardness is HV2000 or more. Since the scratch resistance performance depends on the approximate film thickness and film hardness of the abrasion-resistant layer, the film thickness is desirably allowed to be 0.2 μm or more, and the film hardness is desirably allowed to be as high as possible, in order to improve the scratch resistance and the abrasion resistance. However, since a film thickness of more than 4 μm results in the higher risks of the generation of a crack and peeling due to the rise in film stress and also in a disadvantage in view of cost, the film thickness is desirably allowed to be 4 μm or less.

<Production Method>

Each stacked layer included in the rigid decorative member of the present invention can be formed by a sputtering method, an ion plating method, or the like, and is preferably formed by a reactive sputtering method.

In an embodiment of the present invention, the rigid decorative member 10 is produced by the reactive sputtering method. The sputtering method is a method in which a high voltage with a direct current or an alternating current is applied between targets including atoms included in the base and the coating while introducing an inert gas (mainly an Ar gas) into a chamber evacuated to a vacuum, and ionized Ar is allowed to collide with the targets to form a thrown-up target substance on the base. A slight amount of reactive gas is introduced with the inert gas, whereby a compound coating of the atoms included in the targets and the reactive gas can be formed on the base. The decorative member 10 of the embodiment is produced by controlling adhesion, film hardness, and a color tone by selecting the atoms included in the targets and the reactive gas and adjusting the amounts thereof.

The reactive sputtering method has high controllability of film quality and a film thickness, and is easily automated. Further, since sputtered atoms have high energy, the heating of the base for improving adhesion is not needed, and a film can be formed even on a base such as plastic having a low melting point. Further, because of the method in which the thrown-up target substance is formed on the base, film formation even with a high-melting-point material is possible, and a material is freely selected. Furthermore, a carbide film, a nitride film, a carbonitride film, an oxynitride film, an oxycarbide film, an oxynitrocarbide film, or the like can be easily formed by selecting or mixing reactive gases. Alloying of the atoms included in the targets also enables the formation of an alloy coating, and the formation of the carbide film, nitride film, carbonitride film, oxynitride film, oxycarbide film, oxynitrocarbide film, or the like of an alloy.

A rigid decorative member having such properties as mentioned above can be obtained by the above production method.

<Watch>

A watch provided by the present invention is characterized in that some of parts included in the watch, for example, exterior parts have the rigid decorative member mentioned above. The watch may be any of photovoltaic watches, thermo electric generating watches, radio wave reception type self-correction watches, mechanical watches, and general electronic watches. Such a watch is produced by a known method using the rigid decorative member. The watch is easily flawed by friction with a shirt or by collision with a desk, a wall, or the like. The rigid decorative member of the present invention is formed into the watch, whereby a state in which a flaw is inhibited for many years and an appearance is very beautiful can be maintained. For example, the rigid decorative member mentioned above can be used in the bezel, lug, case, crown, push button, band, and the like of the watch.

<Method for Measuring Film Hardness>

The measurement of film harness was performed using a micro indentation hardness tester (H100 manufactured by FISCHER). A Vickers indenter was used for a gauge head. The Vickers indenter was inserted at a load of 5 mN into a sample, retained for 10 seconds, and thereafter unloaded, and the film hardness was calculated from the depth of an indentation formed by the insertion of the Vickers indenter.

<Method for Testing Scratch Resistance>

A scratch resistance test is carried out as follows. A decorative film is applied to an SUS316L base specified by JIS, and abrasion paper in which alumina particles are homogeneously dispersed is brought into contact with a test sample at a certain load, and is rubbed therewith the certain number of times, whereby flaws are generated. The surface of the flawed test sample was scanned in the direction orthogonal to the direction of the flaws to measure surface roughness, and the scratch resistance was evaluated as average root-mean-square roughness. Since the numerical value of the average root-mean-square roughness is increased with increasing the amount of the generated flaws or with increasing the depths of the flaws while the numerical value of the average root-mean-square roughness is conversely decreased with decreasing the amount of the generated flaws or with decreasing the depths of the flaws, the scratch resistance can be numerically evaluated by the scratch resistance test.

<Method for Testing Corrosion Resistance>

A CASS test is a test according to JIS-H8502, which is a test of putting a sample for 48 hours in an atmosphere, in which a solution obtained by adding cupric chloride to a sodium chloride solution with acetic acid acidity is sprayed, and of observing the peeling and discoloration of the decorative film to evaluate the corrosion resistance.

An artificial sweat test is a test according to ISO 12870, which is a test of placing a sample in an atmosphere in which a liquid in which sodium chloride and lactic acid are mixed (artificial sweat) is aerated at 55° C. for 48 hours, and of observing the degree of the discoloration of the decorative film to evaluate the corrosion resistance.

For alkali resistance, a sample was dipped for 24 hours in a 5% aqueous sodium hydroxide solution at 30° C., and the peeling and discoloration of the decorative film was observed to evaluate the corrosion resistance.

For hypochlorous acid resistance, samples were dipped for 3 hours in 1%, 3% and 6% aqueous sodium hypochlorite solutions at 30° C., and the peeling and discoloration of the decorative films were observed to evaluate the corrosion resistance.

<Method for Measuring Color Tone>

The color tone (brightness, color saturation) of the decorative member was measured using SpectraMagic NX manufactured by KONICA MINOLTA. The L*a*b* of each film was measured with an L*a*b* chromaticity diagram using a light source D65 to measure brightness L* and color saturation $C^*=\sqrt{(a^{*2}+b^{*2})}$, whereby the color tone was measured.

EXAMPLES

Examples of the present invention will be specifically explained below with reference to the drawings.

Example 1

Figure 2:
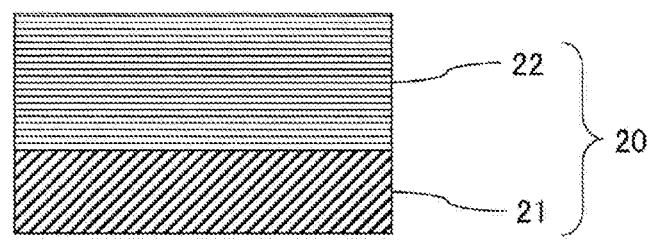
FIG. 2 illustrates a cross-sectional schematic view of a rigid decorative member of Example 1.

In Example 1, a sintered body of 50 wt % Cr and 50 wt % Mo was used as a sputtering target. As illustrated in FIG. 2, an SUS316L material specified by JIS was used as a base 21, and a CrMo alloy carbide film having a thickness of 1.8 um was formed on the base 21 by an Ar gas at a flow rate of 105 sccm and a sputtering method used at a flow rate of 30 sccm, to produce a rigid decorative member 20.

Figure 3:
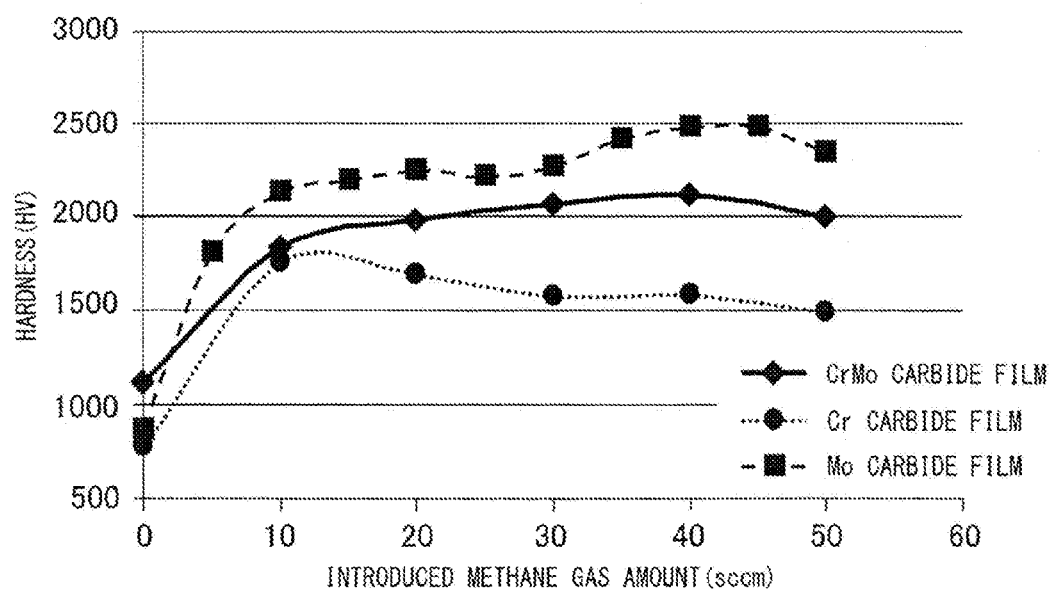
FIG. 3 represents comparisons of the film hardnesses of alloy carbide films produced by changing the amount of a methane gas.

FIG. 3 represents comparisons of the film hardness of the CrMo alloy carbide film, produced by changing the amount of a methane gas, with the film hardnesses of a Cr carbide film and a Mo carbide film. The CrMo alloy carbide film is found to exhibit obviously high hardness compared to the Cr carbide film and to also exhibit high hardness that is approximately equivalent to that of the Mo carbide film.

Since the scratch resistance performance is determined generally by the product of the hardness of the abrasion-resistant layer, the film thickness of the abrasion-resistant layer, the degree of adhesion to the base, and the hardness of the base, it is preferable to form a thick film under the condition of the highest hardness. Therefore, the Mo carbide film is superior to the CrMo alloy carbide film from the viewpoint of film hardness; however, the Mo carbide film has a drawback that it is impossible to maintain performance for exterior parts because of having insufficient corrosion resistance, as mentioned later. Further, since the Cr carbide film has a film hardness of less than HV2000, it is impossible to expect the Cr carbide film to have sufficient scratch resistance performance.

Figure 4:
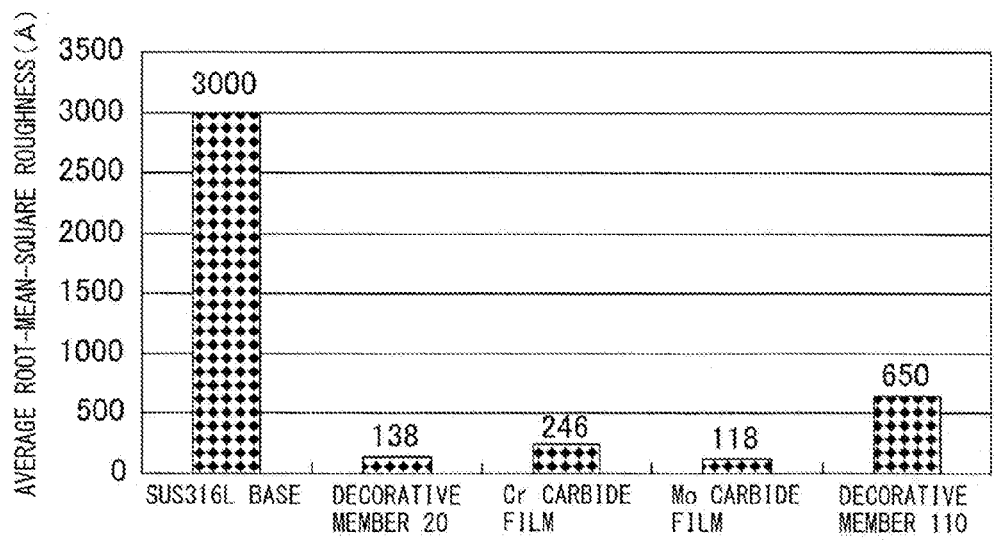
FIG. 4 represents comparisons of the scratch resistances of decorative members.
Figure 7:
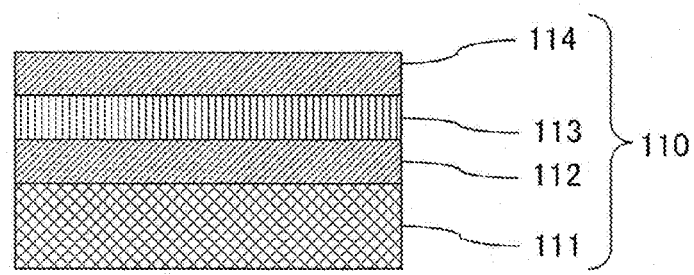
FIG. 7 illustrates a cross-sectional schematic view of a decorative member 110 of a conventional example (produced in reference to Patent Literature 1).

FIG. 4 is a view of the comparison of the scratch resistance of the decorative member 20 produced in Example 1 with those of a Mo carbide film and a Cr carbide film formed to have the same film thickness, an SUS316L base to which no rigid film is applied, and a decorative member 110 (of which the outermost layer is Pt) produced based on Patent Literature 1, as illustrated in FIG. 7. From FIG. 4, it is found that the scratch resistance of the Mo carbide film having high film hardness is highest and the scratch resistance of the Cr carbide film is lowest; and the findings are results obviously derived from film hardness. Since a CrMo alloy carbide film has both characteristics of Cr and Mo, the CrMo alloy carbide film has obviously high scratch resistance performance compared to the Cr carbide film although not achieving the scratch resistance performance of the Mo carbide film.

Figure 5:
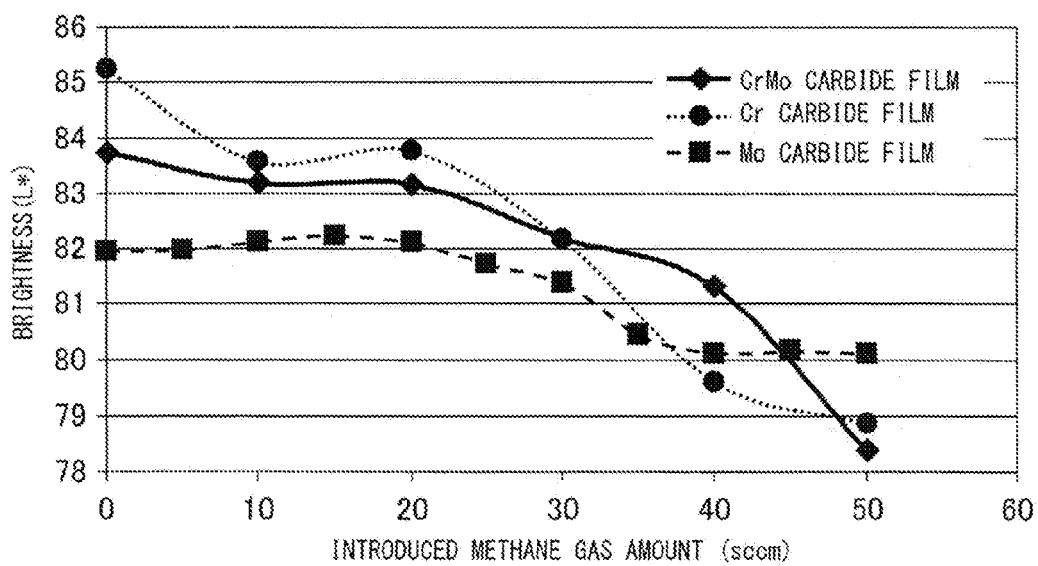
FIG. 5 represents comparisons of the brightnesses of alloy carbide films produced by changing the amount of a methane gas.

FIG. 5 is a view of comparisons of the brightnesses of films produced by changing the amount of a methane gas in the CrMo alloy carbide film. The CrMo alloy carbide film exhibits obviously high brightness compared to the Mo carbide film and to also exhibit high brightness that is approximately equivalent to that of the Cr carbide film.

High brightness is demanded for a decorative trim with a high quality feel. Therefore, it may be considered that a range with the small amount of methane gas in the Cr carbide film is best from the viewpoint of brightness. However, as is clear from FIG. 3, the hardness of the Cr carbide film is low in the range, resulting in insufficient scratch resistance. It is found that Cr and Mo are alloyed, whereby the decorative member having high hardness while maintaining high brightness is obtained.

Figure 6:
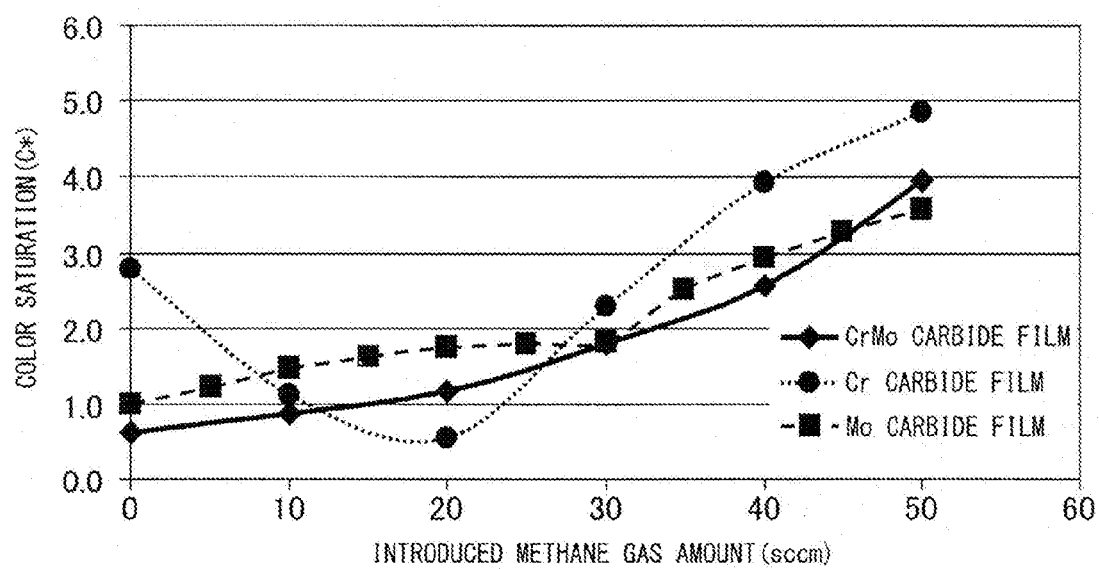
FIG. 6 represents comparisons of the color saturations of alloy carbide films produced by changing the amount of a methane gas.

FIG. 6 is a view of comparisons of the color saturations (C*) of films produced by changing the amount of a methane gas in the CrMo alloy carbide film. The color saturation of the CrMo alloy carbide film substantially exhibited the median value of the Cr carbide film and the Mo carbide film. The appearance color of the CrMo rigid decorative member 20 exhibits L*: 82.16, a*: 0.57, and b*: 1.69 and is therefore found to be substantially the same color as the appearance color of the SUS316L base, exhibiting L*: 85.1, a*: 0.38, and b*: 2.34.

The hardnesses, corrosion resistances, and overall evaluations of the carbide film, the nitride film, and the carbonitride film with respect to the alloy proportions of Cr and Mo are listed in Table 1. As seen in Table 1, maximum hardness and the corrosion resistance are found to be changed depending on the alloy proportion and can be freely adjusted by the alloy proportion. The high proportion of Mo allows film hardness to be increased, resulting in an advantage in scratch resistance; however, when the proportion of Mo is 100 wt % or the proportion of Mo is high, corrosion resistance is poor in a CASS test, application as the decorative member is impossible. Further, the high proportion of Cr allows brightness and corrosion resistance to be high; however, since film hardness is low, scratch resistance is deteriorated, and application as the decorative member is impossible. Compensation for the drawback of each of film hardness, brightness, corrosion resistance, and adhesion is enabled by alloying Cr and Mo. For obtaining the rigid decorative member excellent in the balance of color sense, scratch resistance, and corrosion resistance, the proportion of Cr is desirably 20 wt % or more, more desirably 30 wt % or more.

TABLE 1

| Proportion of Mo (wt %) | Proportion of Cr (wt %) | Carbide Film Maximum Hardness | Nitride Film Maximum Hardness | Carbonitride Film (50:50) Maximum Hardness | Corrosion Resistance CASS 48 h | Corrosion Resistance Artificial Sweat 48 h | Alkali | Hypochlorous Acid Resistance 1% | Hypochlorous Acid Resistance 3% | Hypochlorous Acid Resistance 6% | Overall Evaluation |
|---|---|---|---|---|---|---|---|---|---|---|---|
| 0 | 100 | 1746 | 2143 | 2189 | Good | Good | Good | Good | Good | Good | Poor |
| 50 | 50 | 2120 | 2187 | 2357 | Good | Good | Good | Good | Good | Good | Good |

TABLE 1-continued

| Proportion of Mo (wt %) | Proportion of Cr (wt %) | Carbide Film Maximum Hardness | Nitride Film Maximum Hardness | Carbo-nitride Film (50:50) Maximum Hardness | CASS 48 h | Corrosion Resistance Artificial Sweat 48 h | Alkali | Hypochlorous Acid Resistance 1% | 3% | 6% | Overall Evaluation |
|---|---|---|---|---|---|---|---|---|---|---|---|
| 70 | 30 | 2287 | 2245 | | Good | Good | Good | Good | Good | Good | Good |
| 80 | 20 | 2387 | 2298 | | Good | Good | Good | Good | Fair | Poor | Fair |
| 100 | 0 | 2485 | 2351 | 2503 | Poor | Good | Good | Fair | Poor | Poor | Poor |

Example 2

Figure 8:
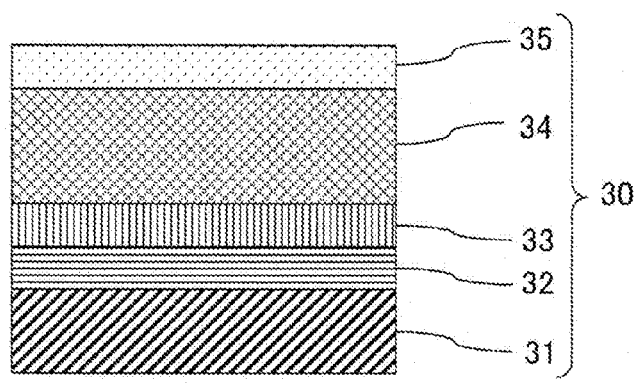
FIG. 8 illustrates a cross-sectional schematic view of a rigid decorative member of Example 2.

In Example 2, a sintered body of 50 wt % Cr and 50 wt % Mo was used as a sputtering target in a manner similar to that of Example 1. As illustrated in FIG. 8, an SUS316L material specified by JIS was used as a base 31, and an adhesion layer 32 of 0.1 µm including a lower oxide of a CrMo alloy was formed on the base 31 by a sputtering method. Thereafter, a methane gas was increased in a gradient manner while introducing the minute amount of oxygen gas, whereby a gradient adhesion layer 33 with a CrMo alloy oxycarbide film of 0.2 µm was formed. Thereafter, a thin-film abrasion-resistant layer 34 including a CrMo alloy carbide film of 2.0 µm was formed. Thereafter, a methane gas was decreased in a gradient manner, whereby a recolored gradient layer 35 with a CrMo alloy carbide film of 0.1 µm was formed to produce a rigid decorative member 30. The appearance color of the rigid decorative member 30 obtained in the Example 2 exhibited L*: 83.74, a*: 0.37, and b*: 0.51 in Lab color space displaying and was substantially the same color as the appearance color of the SUS316L base 21, exhibiting L*: 85.1, a*: 0.38, and b*: 2.34.

The changes of the hardness, brightness, and color saturation of the rigid decorative member 30 with respect to the amount of introduced methane gas are similar to those in FIG. 3, FIG. 5, and FIG. 6 represented in Example 1. The film hardness had a certain peak according to the amount of the introduced methane gas while the brightness was gently decreased according to the amount of the introduced methane gas. A CrMo lower oxide film of 0.1 µm was formed as the adhesion layer 32 of the rigid decorative member 30 by introducing 5 sccm of oxygen gas under the condition of an introduced methane gas amount of 0 sccm in FIG. 3. The use of the CrMo lower oxide for the adhesion layer 32 results in increased adhesion to the base compared to the CrMo alloy film, enabling the improvement of scratch resistance. A CrMo alloy carbide film of 0.2 µm was formed as the gradient adhesion layer 33 by increasing, in a gradient manner, the amount of the introduced methane gas in FIG. 3 from 0 sccm to 40 sccm exhibiting the maximum hardness while introducing 3 sccm of oxygen gas. A CrMo alloy carbide film of 2.0 µm was formed as the abrasion-resistant layer 34 under the condition of an introduced methane gas amount of 40 sccm exhibiting the maximum hardness. A CrMo alloy carbide film of 0.1 µm with an introduced methane gas amount decreased in a gradient manner from 40 sccm, exhibiting the maximum hardness in FIG. 3, to 0 sccm was formed as the recolored gradient layer 35.

The gradient adhesion layer 33 in the rigid decorative member 30 of Example 2 enables the integration of the base and the adhesion layer because of leading to the elimination of a definite interface between the adhesion layer and the abrasion-resistant layer. Since the presence of the gradient adhesion layer allows adhesion between the adhesion layer and the abrasion-resistant layer to be sufficiently secured and provides a structure in which film stress is increased in a gradient manner, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally on the product of the hardness of the abrasion-resistant layer, the film thickness of the abrasion-resistant layer and the degree of adhesion to the base, the scratch resistance can be improved by improving the adhesion to the base.

In the recolored gradient layer 35 in the rigid decorative member 30 of Example 2, the increase of L* and the decrease of C* in Lab color space displaying can be performed in a gradient manner, as seen in FIG. 5 and FIG. 6, by decreasing a carbon content in a gradient manner, and the appearance color of the rigid decorative member 30 can be approximated to that of the SUS316L material which is the base. Furthermore, the recolored gradient layer 35 has high adhesion to the abrasion-resistant layer 34. Accordingly, the recolored gradient layer 35 contributes to the effect of allowing flaws to be inconspicuous and is inhibited from being peeled even if being flawed.

Figure 9:
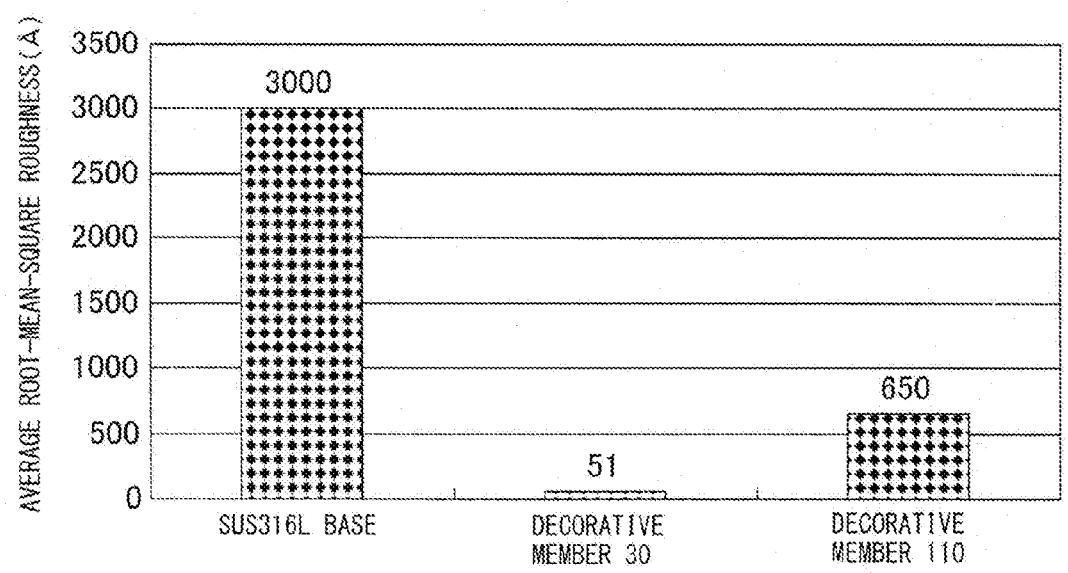
FIG. 9 represents a comparison of the scratch resistance of the rigid decorative member of Example 2.

FIG. 9 is a view of the measurement of the scratch resistance performance in the rigid decorative member 30 of Example 2. The results of measuring the scratch resistances (average root-mean-square roughnesses) of the decorative member 110 (of which the outermost layer is Pt) illustrated in FIG. 7 and produced based on Patent Literature 1, the rigid decorative member 30 of Example 2 according to the present invention, and the SUS316L base on which no rigid film is formed are represented as comparisons in FIG. 9. It was confirmed from FIG. 9 that the rigid decorative member 30 of Example 2 of the present invention had far better scratch resistance performance than those of the SUS316L base on which no rigid film is formed and the decorative member 110 produced based on Patent Literature 1.

Since a structure in which film stress is increased or decreased in a gradient manner is made by using such a film structure as in Example 2, the effect of suppressing the generation of a crack and peeling due to stress strain is obtained, the scratch resistance and the abrasion resistance are improved, the presence of the recolored gradient layer allows the brightness to be increased in a gradient manner in Lab color space displaying, and therefore the decorative member with a sense of higher quality can be provided.

Example 3

In Example 3, a sintered body of 50 wt % Cr and 50 wt % Nb was used as a sputtering target. As illustrated in FIG.

10, an SUS316L material specified by JIS was used as a base 41, and an adhesion layer 42 of 0.1 μm including a lower oxide of a CrNb alloy was formed on the base 41 by a sputtering method. Thereafter, a nitrogen gas was increased in a gradient manner while introducing the minute amount of oxygen gas, whereby a gradient adhesion layer 43 with a CrNb alloy oxynitride film of 0.2 μm was formed. Thereafter, a thin-film abrasion-resistant layer 44 including a CrNb alloy nitride film of 1.8 μm was formed. Thereafter, a nitrogen gas was decreased in a gradient manner, whereby a recolored gradient layer 45 with a CrNb alloy nitride film of 0.1 μm was formed to produce a rigid decorative member 40.

The appearance color of the rigid decorative member 40 obtained in Example 3 in Lab color space displaying exhibits L*: 83.37, a*: 0.05, and b*: 0.61 and is substantially the same color as the appearance color of the SUS316L base 41, exhibiting L*: 85.1, a*: 0.38, and b*: 2.34.

Figure 11:
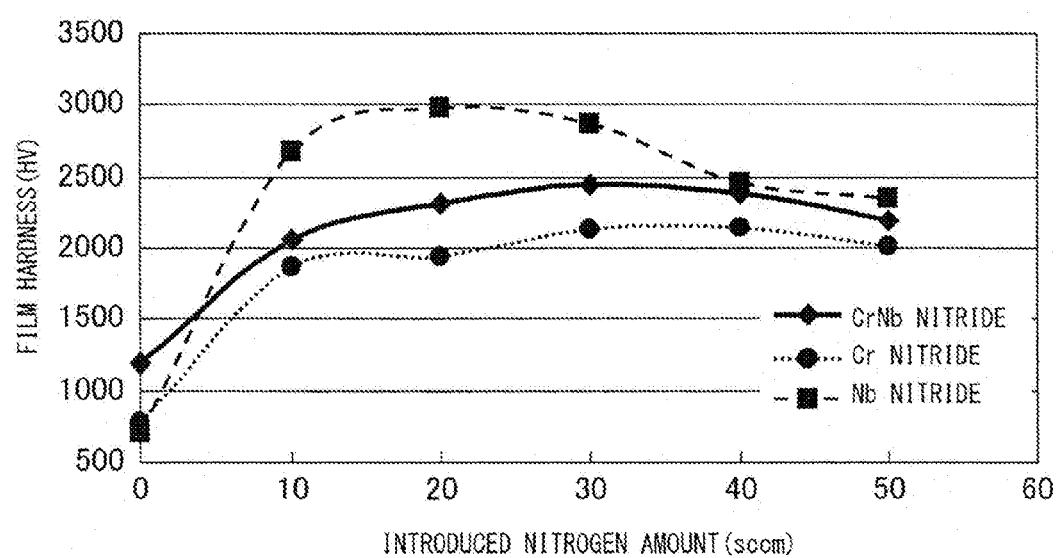
FIG. 11 represents comparisons of the film hardnesses of alloy nitride films produced by changing the amount of a nitrogen gas.

FIG. 11 is a view represented by comparing a change in the hardness of the rigid decorative member 40 of Example 3 in a case in which the amount of introduced nitrogen gas was changed under a constant Ar gas amount of 105 sccm, with changes in the hardnesses of a Cr nitride film and a Nb nitride film. The change in the hardness of the rigid decorative member 40 had a peak, and the rigid decorative member 40 exhibited the maximum hardness under the condition of a nitrogen gas amount of 30 sccm. The CrNb alloy nitride film exhibits obviously high hardness compared to the Cr nitride film and also exhibits high hardness that is approximately equivalent to that of the Nb nitride film.

Figure 12:
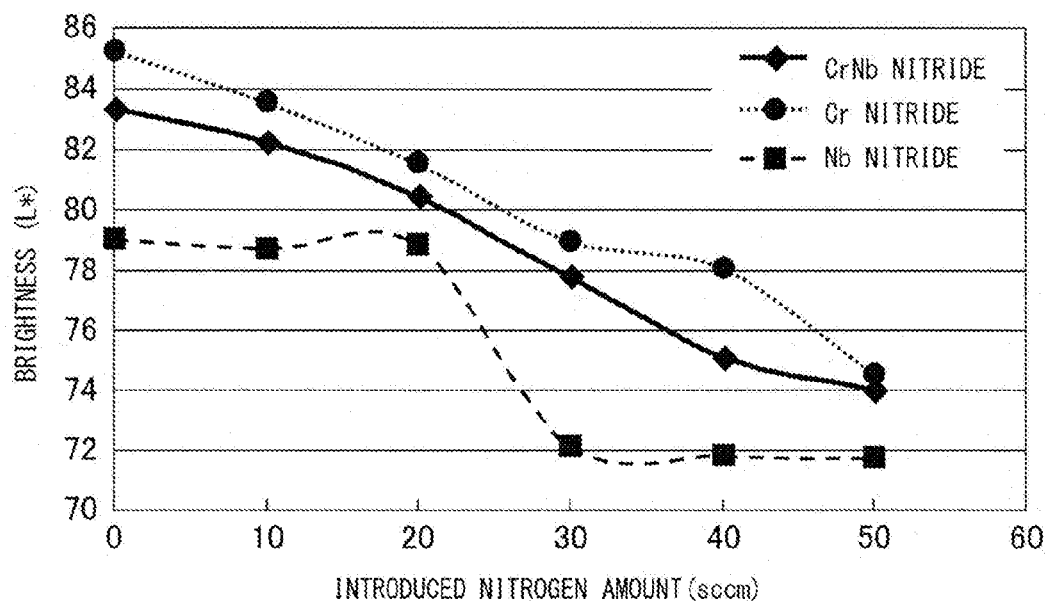
FIG. 12 represents comparisons of the brightnesses of alloy nitride films produced by changing the amount of a nitrogen gas.

FIG. 12 is a view represented by comparing a change in the brightness of the CrNb alloy nitride film in a case in which the amount of introduced nitrogen gas is changed, with those of the Cr nitride film and the Nb nitride film. The CrNb alloy nitride film exhibits obviously high brightness compared to the Nb nitride film and also exhibits high brightness that is approximately equivalent to that of the Cr nitride film.

High brightness is demanded for a decorative trim with a high quality feel. Therefore, it may be considered that a range with the small amount of nitrogen gas in the Cr nitride film is best from the viewpoint of brightness. However, as is clear from FIG. 11, the hardness of the Cr nitride film is low in the range, resulting in insufficient scratch resistance. Cr and Nb are alloyed, whereby the decorative member having high hardness while maintaining high brightness is obtained.

Figure 13:
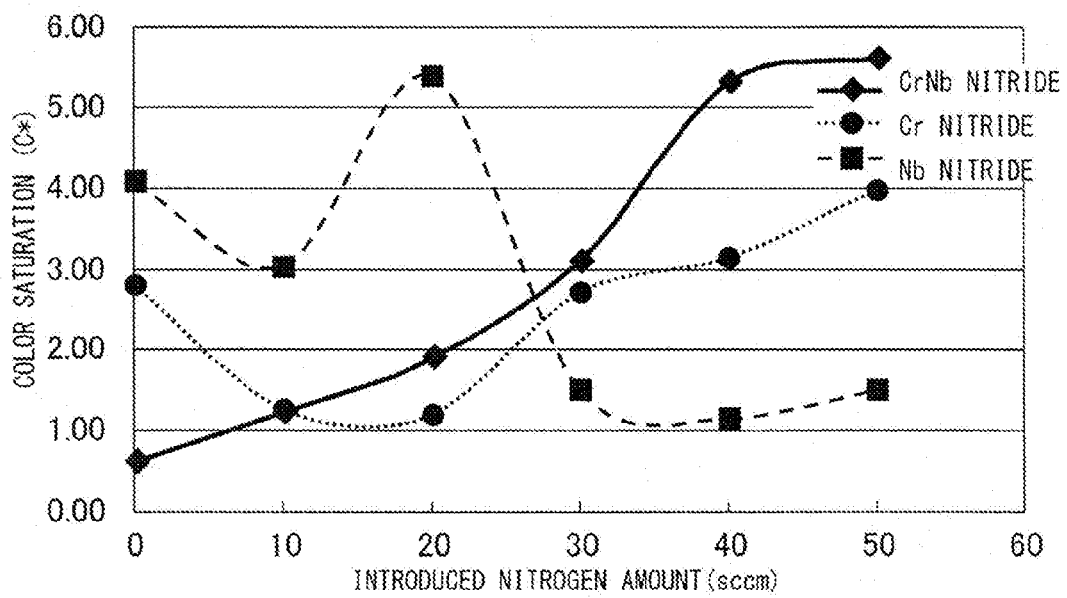
FIG. 13 represents comparisons of the color saturations of alloy nitride films produced by changing the amount of a nitrogen gas.

FIG. 13 is a view represented by comparing a change in the color saturation of the CrNb alloy nitride film in a case in which the amount of introduced nitrogen gas is changed, with changes in the color saturations of the Cr nitride film and the Nb nitride film. The color saturation of the CrNb alloy nitride film is lower than those of the Cr nitride film and the Nb nitride film in a low nitrogen gas range and is higher than those of the Cr nitride film and the Nb nitride film in a high nitrogen gas range. Since the color saturation (C*) is almost zero (0) in the case of white, the CrNb alloy nitride film is found to exhibit a color that is almost white particularly in the low nitrogen gas range.

A CrNb lower oxide film of 0.1 μm was formed as the adhesion layer 42 of the rigid decorative member 40 of Example 3 by introducing 5 sccm of oxygen gas under the condition of an introduced nitrogen gas amount of 0 sccm in FIG. 11. The use of CrNb lower oxide for the adhesion layer 42 results in the higher adhesion of the adhesion layer 42 to the base than that of the CrNb alloy film, enabling the improvement of the scratch resistance of the adhesion layer 42. A CrNb alloy nitride film of 0.2 μm was formed as the gradient adhesion layer 43 by increasing, in a gradient manner, the amount of the introduced nitrogen gas in FIG. 11 from 0 sccm to 30 sccm exhibiting the maximum hardness while introducing 3 sccm of oxygen gas. A CrNb alloy nitride film of 1.8 μm was formed as the abrasion-resistant layer 44 under the condition of an introduced nitrogen gas amount of 30 sccm exhibiting the maximum hardness. A CrNb alloy nitride film of 0.1 μm with an introduced nitrogen gas amount decreased in a gradient manner from an introduced nitrogen gas amount of 30 sccm, exhibiting the maximum hardness in FIG. 11, to 0 sccm was formed as the recolored gradient layer 45.

The gradient adhesion layer 43 in the rigid decorative member 40 of Example 3 enables the integration of the base and the adhesion layer because of leading to the elimination of a definite interface between the adhesion layer and the abrasion-resistant layer. Since the presence of the gradient adhesion layer allows adhesion between the adhesion layer and the abrasion-resistant layer to be sufficiently secured and provides a structure in which film stress is increased in a gradient manner, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally on the product of the hardness of the abrasion-resistant layer, the film thickness of the abrasion-resistant layer and the degree of adhesion to the base, the scratch resistance can be improved by improving the adhesion to the base.

In the recolored gradient layer 45 in the rigid decorative member 40 of Example 3, the increase of L* and the decrease of C* in Lab color space displaying can be performed in a gradient manner, as seen in FIG. 12 and FIG. 13, by decreasing a nitrogen content in a gradient manner, and the appearance color of the rigid decorative member 40 can be approximated to that of the SUS316L material which is the base. The recolored gradient layer 45 has high adhesion to the abrasion-resistant layer 44. Accordingly, the recolored gradient layer 45 contributes to the effect of allowing flaws to be inconspicuous and is inhibited from being peeled even if being flawed.

Figure 14:
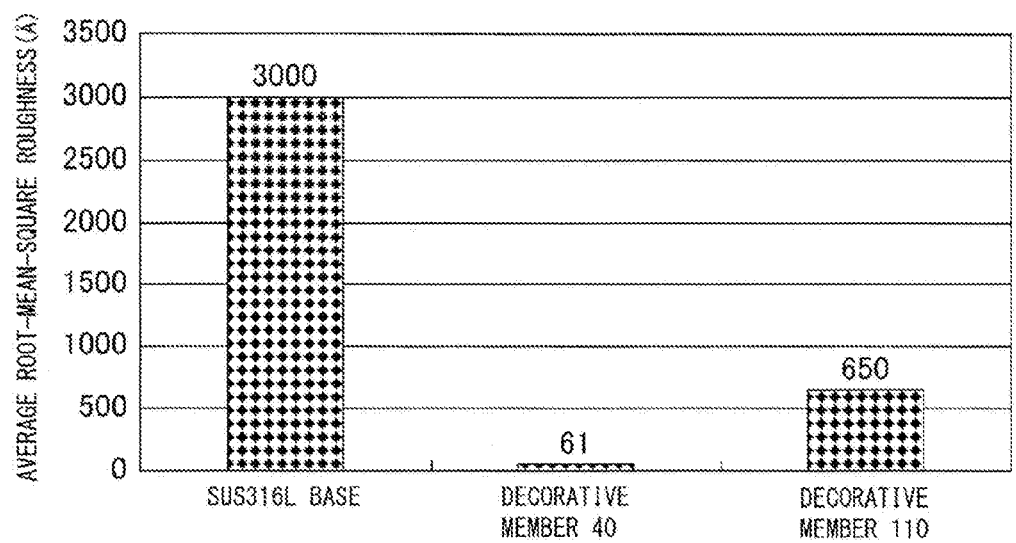
FIG. 14 represents a comparison of the scratch resistance of the rigid decorative member of Example 3.

FIG. 14 is a view representing the results of measuring the scratch resistance performance in the rigid decorative member 40 of Example 3. The results of measuring the scratch resistances (average root-mean-square roughnesses) of the decorative member 110 illustrated in FIG. 7 and produced based on Patent Literature 1, the rigid decorative member 40 of Example 3 according to the present invention, and the SUS316L base on which no rigid film is formed are represented as comparisons in FIG. 14. It was confirmed from FIG. 14 that the rigid decorative member 40 of Example 3 of the present invention had far better scratch resistance performance than those of the SUS316L base on which no rigid film is formed and the decorative member 110 produced based on Patent Literature 1.

The hardnesses, corrosion resistance performances, and overall evaluations of the carbide film, the nitride film, and the carbonitride film with respect to the alloy proportions of Cr and Nb are listed in Table 2. As seen in Table 2, maximum hardness and the corrosion resistance performance are changed depending on the alloy proportion, and the properties can be freely adjusted by the alloy proportion. The high proportion of Cr allows brightness to be increased and adhesion to a base to be also improved, and enables the formation of a thick film, resulting in an advantage in scratch resistance; however, when the proportion of Cr is 100 wt %, film hardness is low, and therefore, it is impossible to obtain high scratch resistance performance. Further, the high proportion of Nb allows film hardness to be high, resulting in an advantage in scratch resistance; however, since brightness is low when the proportion of Nb is high and alkali resistance and hypochlorous acid resistance are poor when the proportion of Nb is 100 wt %, it is impossible to apply a film with the high proportion of Nb to the decorative member. Furthermore, when the proportion of Nb is 100 wt %, the adhesion of a film to the base is poor, and it is impossible to form a thick film. Compensation for the drawback of each of film hardness, brightness, corrosion resistance, and adhesion is enabled by alloying Cr and Nb. For obtaining the rigid decorative member excellent in the balance of color sense, scratch resistance, and an anticorrosion property, the proportion of Cr is desirably 20 wt % or more, more desirably 30 wt % or more.

nitrogen gas is changed, with changes in the brightnesses of the Cr nitride film and the W nitride film. The CrW alloy nitride film exhibits obviously high brightness compared to the W nitride film and also exhibits higher brightness than that of the Cr nitride film in a high nitrogen gas range.

High brightness is demanded for a decorative trim with a high quality feel. Therefore, it may be considered that a range in which the proportion of Cr is 100 wt % and the amount of nitrogen gas is small is best from the viewpoint of brightness. However, as is clear from FIG. 17, the hardness of the Cr nitride film is low in the range, resulting in insufficient scratch resistance. Cr and W are alloyed, whereby the decorative member having high hardness while maintaining high brightness is obtained.

Figure 18:
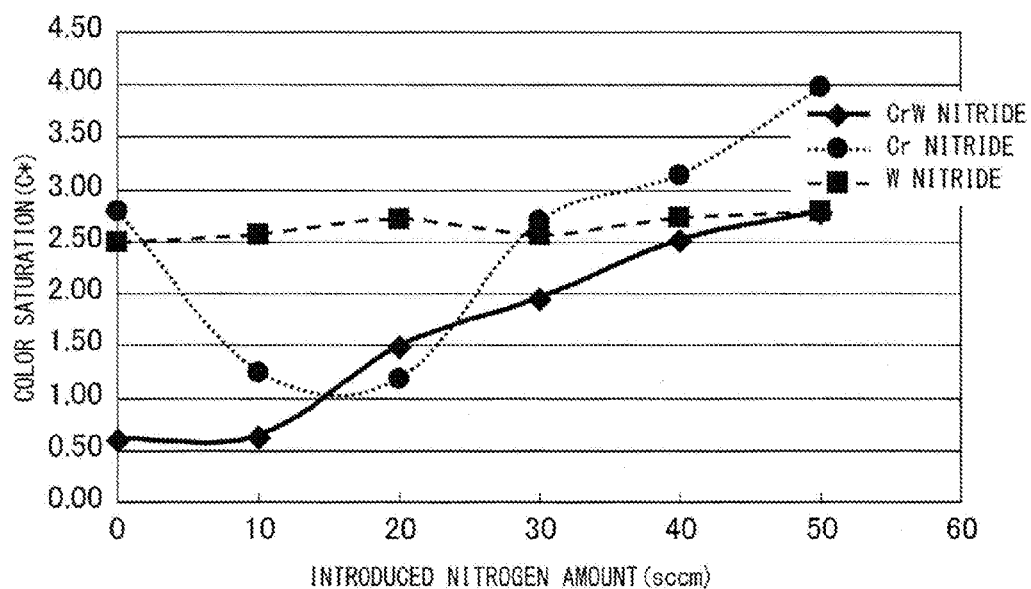
FIG. 18 represents comparisons of the color saturations of alloy nitride films produced by changing the amount of a nitrogen gas.

FIG. 18 is a view represented by comparing a change in color saturation in a case in which the amount of introduced

TABLE 2

| Proportion of W (wt %) | Proportion of Cr (wt %) | Carbide Film Maximum Hardness | Carbo-nitride Nitride Film Maximum Hardness | Corrosion Film (50:50) Maximum Hardness | Resistance | | | Hypochlorous Acid Resistance | | | Overall Evaluation |
|---|---|---|---|---|---|---|---|---|---|---|---|
| | | | | | CASS 48 h | Artificial Sweat 48 h | Alkali | 1% | 3% | 6% | |
| 0 | 100 | 1746 | 2143 | 2189 | Good | Good | Good | Good | Good | Good | Poor |
| 50 | 50 | 2513 | 2452 | 2596 | Good | Good | Good | Good | Good | Good | Good |
| 70 | 30 | 2710 | 2617 | | Good | Good | Good | Good | Good | Good | Good |
| 80 | 20 | 2897 | 2763 | | Good | Good | Good | Good | Good | Fair | Fair |
| 100 | 0 | 3151 | 2980 | 3211 | Good | Good | Fair | Good | Fair | Poor | Poor |

Example 4

Figure 15:
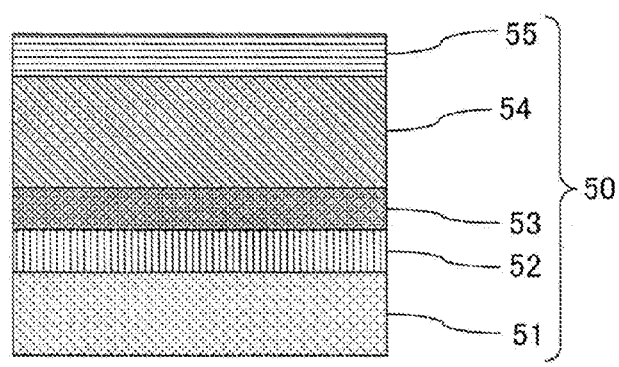
FIG. 15 illustrates a cross-sectional schematic view of a rigid decorative member of Example 4.

In Example 4, a sintered body of 50 wt % Cr and 50 wt % W was used as a sputtering target. In FIG. 15, a JIS2 class Ti base was used as a base 51, and an adhesion layer 52 of 0.1 μm including a lower oxide of a CrW alloy was formed on the base 51 by a sputtering method. Thereafter, a nitrogen gas was increased in a gradient manner while introducing the minute amount of oxygen gas, whereby a gradient adhesion layer 53 with a CrW alloy oxynitride film of 0.2 μm was formed. Thereafter, a thin-film abrasion-resistant layer 54 including a CrW alloy nitride film of 1.8 μm was formed. Thereafter, a nitrogen gas was decreased in a gradient manner, whereby a recolored gradient layer 55 with a CrW alloy nitride film of 0.15 μm was formed to produce a rigid decorative member 50.

The appearance color of the rigid decorative member 50 obtained in Example 4 exhibits L*: 83.42, a*: 0.1, and b*: 0.64 in Lab color space displaying and is substantially the same color as the appearance color of the SUS316L base 41, exhibiting L*: 85.1, a*: 0.38, and b*: 2.34.

Figure 16:
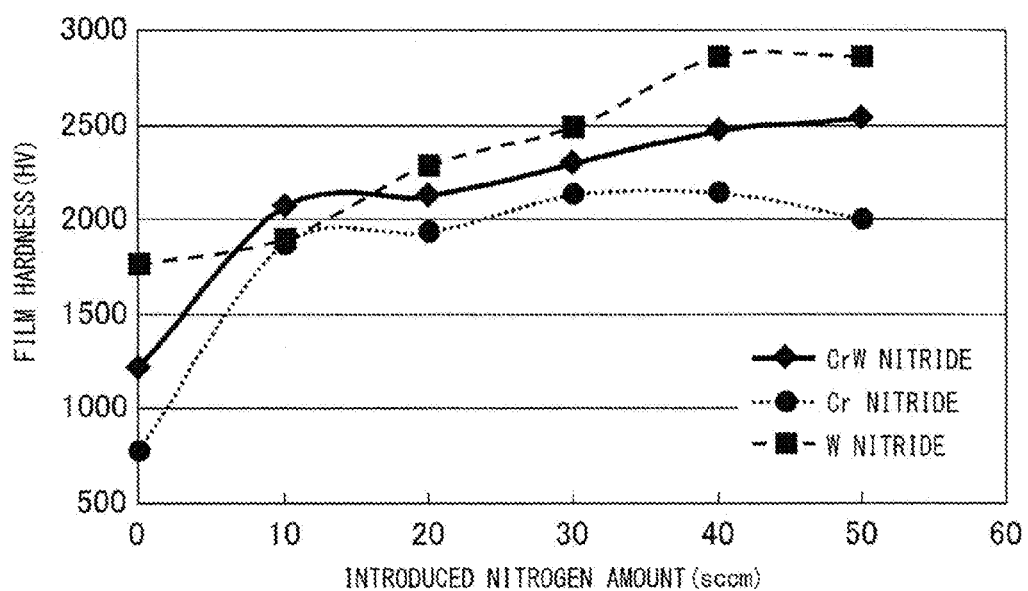
FIG. 16 represents comparisons of the film hardnesses of alloy nitride films produced by changing the amount of a nitrogen gas.

FIG. 16 is a view represented by comparing a change in hardness in a case in which the amount of introduced nitrogen gas was changed under a constant Ar gas amount of 105 sccm, with changes in the hardnesses of a Cr nitride film and a W nitride film, in the rigid decorative member 50 of Example 4. The film hardness increased according to the amount of introduced nitrogen gas and exhibits the maximum hardness under the condition of a nitrogen gas amount of 50 sccm. The CrW alloy nitride film exhibits obviously high hardness compared to the Cr nitride film and also exhibits high hardness that is approximately equivalent to that of the W nitride film.

Figure 17:
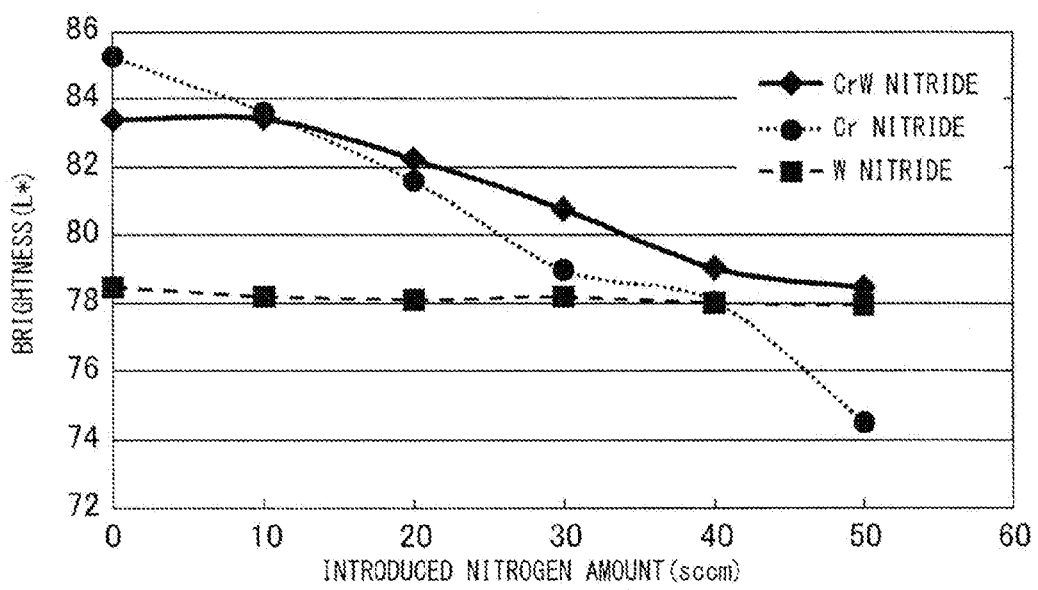
FIG. 17 represents comparisons of the brightnesses of alloy nitride films produced by changing the amount of a nitrogen gas.

FIG. 17 is a view represented by comparing a change in brightness in a case in which the amount of introduced nitrogen gas is changed, with changes in the color saturations of the Cr nitride film and the W nitride film. The color saturation of the CrW alloy nitride film exhibited a lower value than those of the color saturations of the Cr nitride film and the W nitride film. Since the color saturation (C*) is almost zero (0) in the case of white, the CrW alloy nitride film is found to exhibit a color that is closer to white particularly in the low nitrogen gas range.

Figure 10:
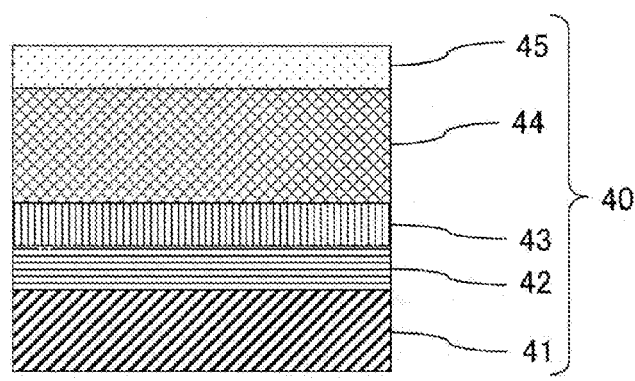
FIG. 10 illustrates a cross-sectional schematic view of a rigid decorative member of Example 3.

A CrW lower oxide film of 0.1 μm was formed as the adhesion layer 52 of the rigid decorative member 50 of Example 4 by introducing 5 sccm of oxygen gas under the condition of an introduced nitrogen gas amount of 0 sccm in FIG. 16. The use of CrW lower oxide for the adhesion layer 52 results in the higher adhesion of the film to the base than that of the CrW alloy film, enabling improvement in scratch resistance. A CrW alloy nitride film of 0.2 μm was formed as the gradient adhesion layer 53 by increasing, in a gradient manner, the amount of the introduced nitrogen gas in FIG. 16 from 0 sccm to 50 sccm exhibiting the maximum hardness while introducing 3 sccm of oxygen gas. A CrW alloy nitride film of 1.8 μm was formed as the abrasion-resistant layer 54 under the condition of an introduced nitrogen gas amount of 50 sccm exhibiting the maximum hardness. A CrW alloy nitride film of 0.15 μm was formed as the recolored gradient layer 55 by decreasing the amount of introduced nitrogen gas in a gradient manner from 50 sccm, exhibiting the maximum hardness in FIG. 16, to 10 sccm.

The gradient adhesion layer 53 in the rigid decorative member 50 of Example 4 enables the integration of the base and the adhesion layer because of leading to the elimination of a definite interface between the adhesion layer and the abrasion-resistant layer. Since the presence of the gradient adhesion layer allows adhesion between the adhesion layer and the abrasion-resistant layer to be sufficiently secured and provides a structure in which film stress is increased in a gradient manner, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally on the product of the hardness of the abrasion-resistant layer, the film thickness of the abrasion-resistant layer, and the degree of adhesion to the base, the scratch resistance can be improved by improving the adhesion to the base.

high, resulting in an advantage in scratch resistance; however, since brightness is low and hypochlorous acid resistance is poor, application to the decorative member is impossible. Furthermore, when the proportion of W is 100 wt %, the adhesion to the base is poor due to high film stress, and it is impossible to form a thick film. Compensation for the drawback of each of film hardness, brightness, corrosion resistance, and adhesion is enabled by alloying Cr and W. For obtaining the rigid decorative member excellent in color, scratch resistance, and an anticorrosion property, the proportion of Cr is desirably 20 wt % or more, more desirably 30 wt % or more.

TABLE 3

| Proportion of Mo (wt %) | Proportion of Cr (wt %) | Carbide Film Maximum Hardness | Nitride Film Maximum Hardness | Carbonitride Film (50:50) Maximum Hardness | Corrosion Resistance CASS 48 h | Artificial Sweat 48 h | Alkali | Hypochlorous Acid Resistance 1% | 3% | 6% | Overall Evaluation |
|---|---|---|---|---|---|---|---|---|---|---|---|
| 0 | 100 | 1746 | 2143 | 2189 | Good | Good | Good | Good | Good | Good | Poor |
| 50 | 50 | 2544 | 2532 | 2601 | Good | Good | Good | Good | Good | Good | Good |
| 70 | 30 | 2777 | 2727 | 2698 | Good | Good | Good | Good | Good | Good | Good |
| 80 | 20 | 2989 | 2777 | 2814 | Good | Good | Good | Good | Good | Fair | Fair |
| 100 | 0 | 3174 | 2863 | | Good | Good | Fair | Good | Fair | Poor | Poor |

In the recolored gradient layer 55 in the rigid decorative member 50 of Example 4, the increase of L* and the decrease of C* in Lab color space displaying can be performed in a gradient manner, as seen in FIG. 17 and FIG. 18, by decreasing a nitrogen content in a gradient manner, and the appearance color of the rigid decorative member 50 can be approximated to that of the SUS316L material which is the base. The recolored gradient layer 55 has high adhesion to the abrasion-resistant layer 54. Accordingly, the recolored gradient layer 55 contributes to the effect of allowing flaws to be inconspicuous and is inhibited from being peeled even if being flawed.

Figure 19:
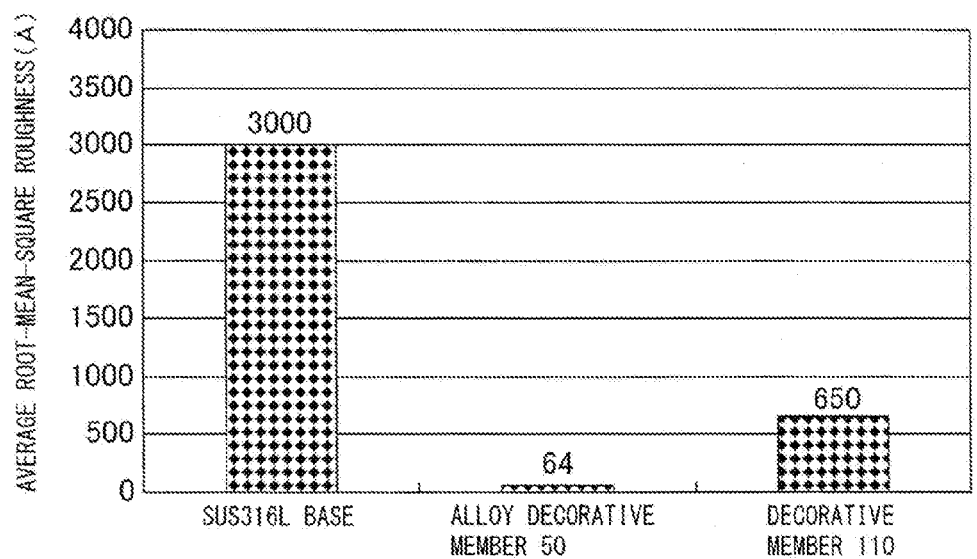
FIG. 19 represents a comparison of the scratch resistance of the rigid decorative member of Example 4.
Figure 20:
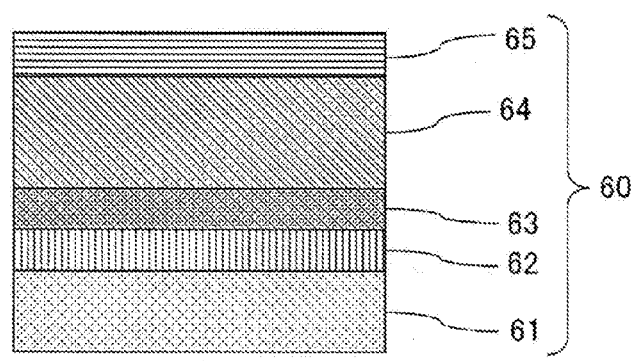
FIG. 20 illustrates a cross-sectional schematic view of a rigid decorative member of Example 5.

FIG. 19 is a view representing the results of measuring the scratch resistance performance in the rigid decorative member 50 of Example 4. The results of measuring the scratch resistances (average root-mean-square roughnesses) of the decorative member 110 (of which the outermost layer is Pt) illustrated in FIG. 7 and produced based on Patent Literature 1, the rigid decorative member 50 of Example 4 according to the present invention, and the SUS316L base on which no rigid film is formed are represented as comparisons. It was confirmed from FIG. 19 that the rigid decorative member 50 of Example 4 of the present invention had far better scratch resistance performance than those of the SUS316L base on which no rigid film is formed and the decorative member 110 produced based on Patent Literature 1.

The hardnesses, corrosion resistance performances, and overall evaluations of the carbide film, the nitride film, and the carbonitride film with respect to the alloy proportions of Cr and W are listed in Table 3. As seen in Table 3, maximum hardness and the corrosion resistance performance are changed depending on the alloy proportion and can be freely adjusted by the alloy proportion. The high proportion of Cr allows brightness to be increased and adhesion to a base to be also improved, and enables a thick film, resulting in an advantage in scratch resistance; however, when the proportion of Cr is 100 wt %, film hardness is low, and it is impossible to obtain high scratch resistance performance. Further, the high proportion of W allows film hardness to be Example 5

In Example 5, a sintered body of 40 wt % Cr and 60 wt % Ti was used as a sputtering target. A JIS2 class Ti base was used as a base 61, and an adhesion layer 62 of 0.1 μm including a lower oxide of a CrTi alloy was formed on the base 61 by a sputtering method. Thereafter, a methane gas was increased in a gradient manner while introducing the minute amount of oxygen gas, whereby a gradient adhesion layer 63 with a CrTi alloy oxycarbide film of 0.2 μm was formed. Thereafter, a thin-film abrasion-resistant layer 64 including a CrTi alloy carbide film of 1.7 μm was formed. Thereafter, a methane gas was decreased in a gradient manner, whereby a recolored gradient layer 65 with a CrTi alloy carbide film of 0.1 μm was formed to produce a rigid decorative member 60.

The appearance color of the rigid decorative member 60 obtained in Example 5 in Lab color space displaying exhibits L*: 82.34, a*: 0.97, and b*: 0.77 and is substantially the same color as the appearance color of the SUS316L base 41, exhibiting L*: 85.1, a*: 0.38, and b*: 2.34.

Figure 21:
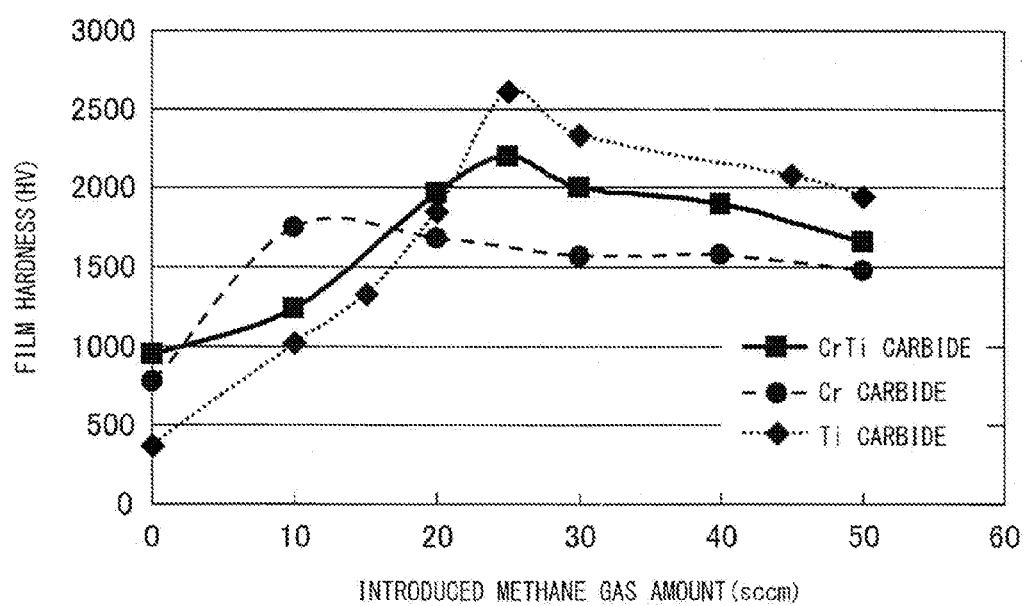
FIG. 21 represents comparisons of the film hardnesses of alloy nitride films produced by changing the amount of a methane gas.

FIG. 21 represents a view of comparisons of a change in hardness in a case in which the amount of introduced methane gas was changed under a constant Ar gas amount of 105 sccm, with changes in the hardnesses of a Cr carbide film and a Ti carbide film, in the rigid decorative member 60 of Example 5. The change in hardness had a hardness peak, and the change in the hardness of the Ti carbide film exhibited the maximum hardness under the condition of a methane gas amount of 25 sccm. The CrTi alloy carbide film exhibited obviously high hardness in a high methane gas range compared to the Cr carbide film.

Figure 22:
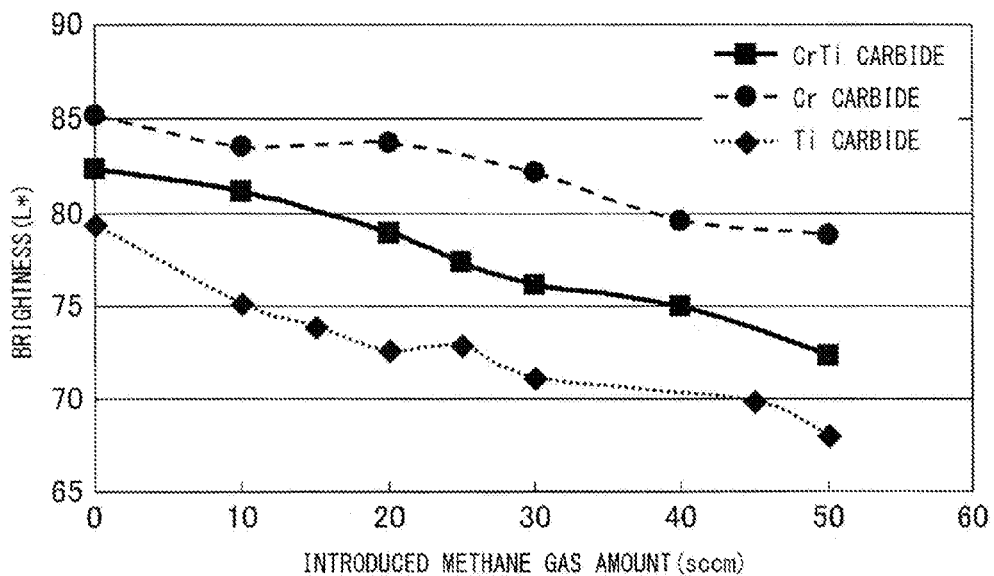
FIG. 22 represents comparisons of the brightnesses of alloy nitride films produced by changing the amount of a methane gas.

FIG. 22 is a view represented by comparing a change in brightness in a case in which the amount of introduced methane gas is changed, with changes in the brightnesses of the Cr carbide film and the Ti carbide film. The brightness of the CrTi alloy carbide film exhibits approximately the median value of the brightness of the Cr carbide film and the brightness of the Ti carbide film and is obviously high compared to the Ti carbide film.

High brightness is demanded for a decorative trim with a high quality feel. Therefore, it may be considered that a range in which the proportion of Cr is 100 wt % and the amount of methane gas is small is best from the viewpoint of brightness. However, as is clear from FIG. 21, the hardness of the Cr carbide film is low in the range, resulting in insufficient scratch resistance. Cr and Ti are alloyed, whereby the decorative member having high hardness while maintaining high brightness is obtained.

Figure 23:
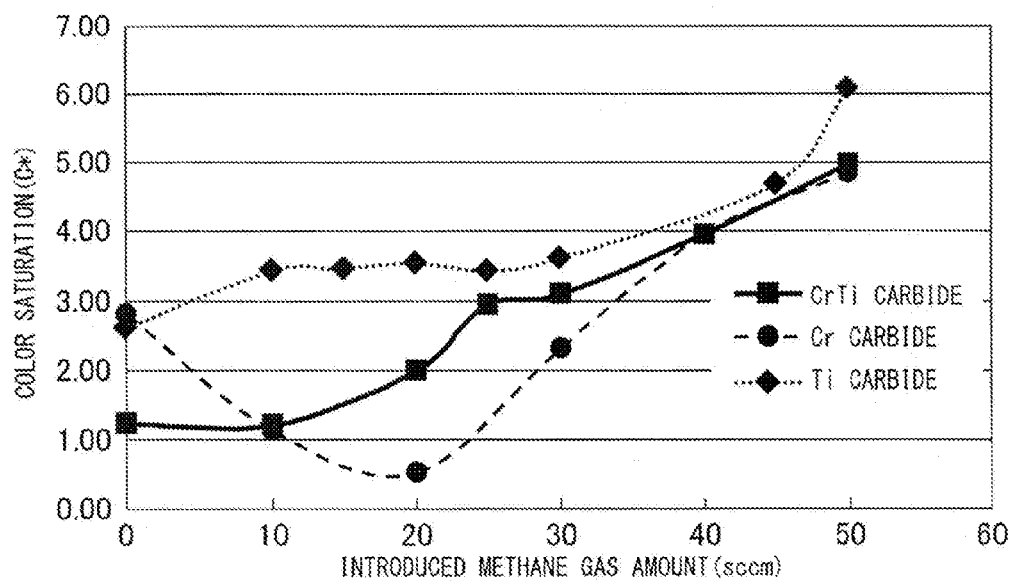
FIG. 23 represents comparisons of the color saturations of alloy nitride films produced by changing the amount of a methane gas.

FIG. 23 is a view represented by comparing a change in color saturation in a case in which the amount of introduced methane gas is changed, with changes in the color saturations of the Cr carbide film and the Ti carbide film. The color saturation of the CrTi alloy carbide film exhibited approximately the median value of the color saturation of the Cr carbide film and the color saturation of the Ti carbide film and exhibited the lowest value under the condition of 10 sccm of methane gas. Since the color saturation (C*) is almost zero (0) in the case of white, the CrTi alloy carbide film exhibits a color that is closer to white particularly in the low methane gas range.

A CrTi lower oxide film of 0.1 μm was formed as the adhesion layer 62 of the rigid decorative member 60 of Example 5 by introducing 5 sccm of oxygen gas under the condition of an introduced methane gas amount of 0 sccm in FIG. 21. The use of CrTi lower oxide for the adhesion layer 62 results in higher adhesion to the base than that of the CrTi alloy film, enabling improvement in scratch resistance. A CrTi alloy carbide film of 0.2 μm was formed as the gradient adhesion layer 63 by increasing, in a gradient manner, the amount of the introduced methane gas in FIG. 21 from 0 sccm to 25 sccm exhibiting the maximum hardness while introducing 3 sccm of oxygen gas. A CrTi alloy carbide film of 1.7 μm was formed as the abrasion-resistant layer 64 under the condition of an introduced methane gas amount of 25 sccm exhibiting the maximum hardness. A CrTi alloy carbide film of 0.1 μm was formed as the recolored gradient layer 65 by decreasing the amount of introduced methane gas in a gradient manner from 25 sccm, exhibiting the maximum hardness in FIG. 21, to 0 sccm.

The gradient adhesion layer 63 in the rigid decorative member 60 of Example 5 enables the integration of the base and the adhesion layer because of leading to the elimination of a definite interface between the adhesion layer and the abrasion-resistant layer. Since the presence of the gradient adhesion layer allows adhesion between the adhesion layer and the abrasion-resistant layer to be sufficiently secured and provides a structure in which film stress is increased in a gradient manner, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally on the product of the hardness of the abrasion-resistant layer, the film thickness of the abrasion-resistant layer and the degree of adhesion to the base, the scratch resistance can be improved by improving the adhesion to the base.

In the recolored gradient layer 65 in the rigid decorative member 60 of Example 5, the increase of L* and the decrease of C* in Lab color space displaying can be performed in a gradient manner, as seen in FIG. 22 and FIG. 23, by decreasing a carbon content in a gradient manner, and the appearance color of the rigid decorative member 60 can be approximated to that of the SUS316L material which is the base. The recolored gradient layer 65 has high adhesion to the abrasion-resistant layer 64. Accordingly, the recolored gradient layer 65 contributes to the effect of allowing flaws to be inconspicuous and is inhibited from being peeled even if being flawed.

Figure 24:
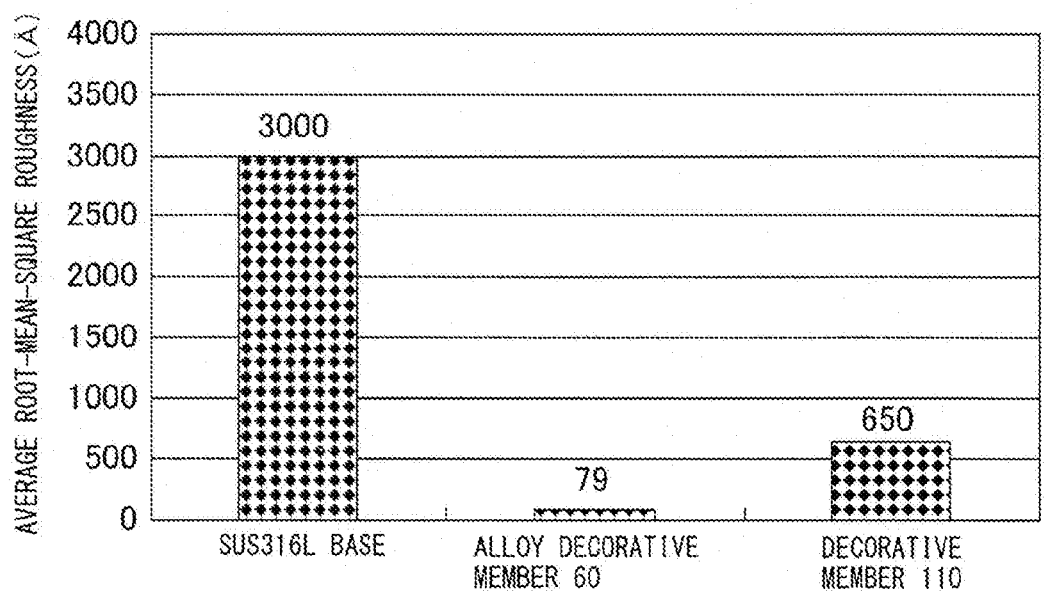
FIG. 24 represents a comparison of the scratch resistance of the rigid decorative member of Example 5.

FIG. 24 is a view representing the results of measuring the scratch resistance performance in the rigid decorative member 60 of Example 5. The results of measuring the scratch resistances (average root-mean-square roughnesses) of the decorative member 110 (the outermost layer is Pt) illustrated in FIG. 7 and produced based on Patent Literature 1, the rigid decorative member 60 of Example 5 according to the present invention, and the SUS316L base on which no rigid film is formed are represented as comparisons. It was confirmed from FIG. 24 that the rigid decorative member 60 of Example 5 of the present invention had far better scratch resistance performance than those of the SUS316L base on which no rigid film is formed and the decorative member 110 produced based on Patent Literature 1.

The hardness, corrosion resistance performance, and overall evaluations of the carbide film with respect to the alloy proportions of Cr and Ti are listed in Table 4. Since Group 4A including Ti, Hf, and Zr presents a gold color when a nitride film is formed, limitation to a carbide film is performed when Group 4A is alloyed. As seen in Table 4, maximum hardness and the corrosion resistance performance are changed depending on the alloy proportion and can be freely adjusted by the alloy proportion. The high proportion of Cr allows brightness to be increased. The high proportion of Cr allows adhesion to a base to be also improved and enables a thick film, resulting in an advantage in scratch resistance; however, when the proportion of Cr is 100 wt %, film hardness is low, and it is impossible to obtain high scratch resistance performance. Further, the high proportion of Ti allows film hardness to be high, resulting in an advantage in scratch resistance; however, since brightness is low and film stress is high when the proportion of Ti is 100 wt %, the adhesion to the base is poor, and it is impossible to form a thick film. Compensation for the drawback of each of film hardness, brightness, corrosion resistance, and adhesion is enabled by alloying Cr and Ti. For obtaining the rigid decorative member excellent in the balance of color sense, scratch resistance, and an anticorrosion property, the proportion of Cr is desirably 20 wt % or more.

TABLE 4

| Proportion of Ti (wt %) | Proportion of Cr (wt %) | Carbide Film Maximum Hardness | Corrosion Resistance CASS 48 h | Artificial Sweat 48 h | Alkali | Hypochlorous Acid Resistance 1% | 3% | 6% | Overall Evaluation |
|---|---|---|---|---|---|---|---|---|---|
| 0 | 100 | 1746 | Good | Good | Good | Good | Good | Good | Poor |
| 60 | 40 | 2199 | Good | Good | Good | Good | Good | Good | Good |

TABLE 4-continued

| Proportion of Ti (wt %) | Proportion of Cr (wt %) | Carbide Film Maximum Hardness | CASS 48 h | Corrosion Resistance Artificial Sweat 48 h | Alkali | Hypochlorous Acid Resistance 1% | 3% | 6% | Overall Evaluation |
|---|---|---|---|---|---|---|---|---|---|
| 80 | 20 | 2544 | Good | Good | Good | Good | Good | Good | Good |
| 100 | 0 | 2612 | Good | Good | Fair | Good | Good | Good | Poor |

INDUSTRIAL APPLICABILITY

In accordance with the present invention, there can be provided a rigid decorative member in which deterioration of appearance quality due to a flaw, abrasion, or the like is suppressed and which has a color tone with a high quality feel, there can be further provided a product of which the film hardness, scratch resistance performance, abrasion resistance performance, color tone, and corrosion resistance performance can be freely controlled, and therefore, industrial applicability is high.

REFERENCE SIGNS LIST

10 Rigid decorative member of embodiment of the present invention
11 Base
12 Abrasion-resistant layer
110 Decorative member of conventional example (produced based on Patent Literature 1)
111 Base
112 Adhesion layer
113 Abrasion-resistant layer
114 Pt layer
20 Rigid decorative member of Example 1
21 SUS316L base
22 CrMo alloy abrasion-resistant layer
30 Rigid decorative member of Example 2
31 SUS316L base
32 CrMo alloy lower oxide film adhesion layer
33 CrMo alloy oxycarbide film gradient adhesion layer
34 CrMo alloy carbide film abrasion-resistant layer
35 CrMo alloy carbide film recolored gradient layer
40 Rigid decorative member of Example 3
41 SUS316L base
42 CrNb alloy lower oxide film adhesion layer
43 CrNb alloy oxynitride film gradient adhesion layer
44 CrNb alloy nitride film abrasion-resistant layer
45 CrNb alloy nitride film recolored gradient layer
50 Rigid decorative member of Example 4
51 Ti base
52 CrW alloy lower oxide film adhesion layer
53 CrW alloy oxynitride film gradient adhesion layer
54 CrW alloy nitride film abrasion-resistant layer
55 CrW alloy nitride film recolored gradient layer
60 Rigid decorative member of Example 5
61 Ti base
62 CrTi alloy lower oxide film adhesion layer
63 CrTi alloy oxycarbide film gradient adhesion layer
64 CrTi alloy carbide film abrasion-resistant layer
65 CrTi alloy carbide film recolored gradient layer

The invention claimed is:

1. A rigid decorative member comprising:
a base; and
a rigid decorative coating with plural layers containing a reaction compound of an alloy of Cr and one or two or more selected from the group consisting of Mo, W, Nb, Ta, Ti, Hf, Zr, and V, and of one or two or more non-metallic elements of nitrogen, carbon, and oxygen, stacked on the base, wherein,
said rigid decorative coating with the several layers comprises an adhesion layer stacked on the substrate, a gradient adhesion layer stacked on the adhesion layer, an abrasion-resistant layer stacked on the gradient adhesion layer, and a recolored gradient layer stacked on the abrasion-resistant layer;
a non-metallic element in the adhesion layer is low-concentration oxygen;
a non-metallic element in the gradient adhesion layer, the abrasion-resistant layer, and the recolored gradient layer comprises one or two or more of nitrogen, carbon, and oxygen;
the content of a non-metallic element in a reaction compound included in the gradient adhesion layer is increased in a gradient manner in a thickness direction with departing from the substrate; and
the content of a non-metallic element in a reaction compound included in the recolored gradient layer is increased or decreased in a gradient manner in a thickness direction with departing from the substrate.

2. The rigid decorative member according to claim 1, wherein the non-metallic element in the coating mainly comprises nitrogen.

3. The rigid decorative member according to claim 1, wherein the thickness of the abrasion-resistant layer is 0.5 to 4 μm.

4. The rigid decorative member according to claim 1, wherein the proportion of the Cr is 20 wt % or more.

5. The rigid decorative member according to claim 1, wherein the appearance color of the rigid decorative member is a white color or a stainless steel color.

6. A watch comprising an exterior part of which at least a portion comprises the rigid decorative member according to claim 1.

7. A method for producing the rigid decorative member according to claim 1, comprising at least one step of:
a step of forming the adhesion layer by a reactive sputtering method;
a step of forming the gradient adhesion layer by a reactive sputtering method;
a step of forming the abrasion-resistant layer by a reactive sputtering method; and
a step of forming the recolored gradient layer by a reactive sputtering method.

8. The method for producing a rigid decorative member according to claim 7, wherein the amount of a reactant gas containing the non-metallic element used in the reactive sputtering method in the step of forming the gradient adhesion layer and the step of forming the recolored gradient layer is chronologically increased or decreased.

* * * * *